United States Patent
Inoue et al.

(10) Patent No.: US 8,822,131 B2
(45) Date of Patent: Sep. 2, 2014

(54) FLEXOGRAPHIC PRINTING PLATE PRECURSOR

(71) Applicant: Tokai Rubber Industries, Ltd., Aichi-ken (JP)

(72) Inventors: Daisuke Inoue, Aichi-ken (JP); Koki Matsuoka, Aichi-ken (JP); Hideyuki Hashimoto, Aichi-ken (JP)

(73) Assignee: Tokai Rubber Industries, Ltd., Aichi-ken (JP)

( * ) Notice: Subject to any disclaimer, the term of this patent is extended or adjusted under 35 U.S.C. 154(b) by 0 days.

(21) Appl. No.: 13/905,620

(22) Filed: May 30, 2013

(65) Prior Publication Data

US 2013/0260121 A1 Oct. 3, 2013

Related U.S. Application Data

(63) Continuation of application No. PCT/JP2011/069702, filed on Aug. 31, 2011.

(30) Foreign Application Priority Data

Dec. 24, 2010 (JP) ................ 2010-287856

(51) Int. Cl.
*G03F 7/00* (2006.01)
*G03F 7/26* (2006.01)

(52) U.S. Cl.
USPC .......... 430/270.1; 430/281.1; 430/285.1; 430/306

(58) Field of Classification Search
USPC .......... 430/270.1, 281.1, 283.1, 306
See application file for complete search history.

(56) References Cited

U.S. PATENT DOCUMENTS

| | | |
|---|---|---|
| 2010/0167202 A1 | 7/2010 | Yoshimoto et al. |
| 2010/0247867 A1 * | 9/2010 | Yoshida ............ 428/156 |
| 2010/0255241 A1 * | 10/2010 | Wada et al. ........ 428/41.8 |

FOREIGN PATENT DOCUMENTS

| | | |
|---|---|---|
| EP | 0741330 A1 | 11/1996 |
| EP | 1306725 A1 | 5/2003 |
| EP | 1555572 A1 | 7/2005 |
| EP | 2284612 A1 | 2/2011 |
| JP | 2006-163284 | 6/2009 |
| JP | 2009-244314 | 10/2009 |
| JP | 2009-288700 | 12/2009 |
| JP | 2009288700 A * | 12/2009 |
| JP | 2010-237583 | 10/2010 |

OTHER PUBLICATIONS

International Search Report for International Application No. PCT/JP2011/069702, mailed on Oct. 11, 2011.
Japanese Office Action in counterpart Application No. JP2010-287856, dated Jul. 1, 2014 (with English-language translation).
European Extended Search Report in counterpart Application No. 11 850 751.6, dated Jun. 10, 2014.

* cited by examiner

*Primary Examiner* — Chanceity Robinson
(74) *Attorney, Agent, or Firm* — Greenblum & Bernstein, P.L.C.

(57) ABSTRACT

Disclosed is a flexographic printing plate precursor in which formation of cracks and wrinkles in an infrared ablation layer is suppressed and the scratch resistance of the layer is improved. The precursor includes a support, photosensitive resin layer, and an infrared ablation layer that are laminated in the order presented. The binder polymer contained in the infrared ablation layer contains a polymer (A) and an acrylic resin (B). The polymer (A) contains the same structural unit as the structural unit contained in the binder polymer in the photosensitive resin layer. The mass ratio (A/B) of the component (A) with respect to the component (B) is within a range of 1/3 to 3/1. The difference between a plastic hardness (Ha) of the infrared ablation layer and a plastic hardness (Hb) of the photosensitive resin layer is 30 mN/mm$^2$ or smaller.

8 Claims, 3 Drawing Sheets

FLEXOGRAPHIC PRINTING PLATE PRECURSOR

CLAIM FOR PRIORITY

This application is a continuation of PCT/JP2011/069702 filed Aug. 31, 2011, and claims the priority benefit of Japanese Application No. 2010-287856, filed Dec. 24, 2010, the contents of which are expressly incorporated by reference in their entirety.

TECHNICAL FIELD

The present invention relates to a flexographic printing plate precursor, and more specifically relates to a flexographic printing plate precursor that comprises an infrared ablation layer. In the flexographic printing plate precursor, a negative pattern is formed by directly transferring a negative image in a form of digitized information onto the infrared ablation layer with an infrared laser beam.

BACKGROUND ART

Conventionally, a printing plate is used for relief printing, intaglio printing, and lithographic printing on an object to be printed such as a packing material, a label, and a magazine. A relief printing plate is used for the relief printing. Examples of the relief printing plate include a flexographic printing plate, which may be applied to printing on various objects to be printed because of its flexibility.

Generally, a flexographic printing plate precursor comprises a photosensitive resin layer made of a photosensitive resin composition on a support made of such as a polyester film. A flexographic printing plate is made by exposing the photosensitive resin layer of the precursor to ultraviolet light according to a predetermined image and by removing unexposed portions of the resin.

In the case of a flexographic printing plate precursor for so-called analog printing, a negative film having a preformed image is put on the photosensitive resin layer, and the layer is exposed to light through the negative film to reproduce the image. Meanwhile, in the case of a flexographic printing plate precursor for laser-ablation-mask (LAM) printing, an infrared ablation layer is preformed on the photosensitive resin layer. A predetermined negative pattern is formed by directly transferring a negative image in a form of digitized information onto the infrared ablation layer with an infrared laser beam. Then, the photosensitive resin layer is exposed to light thorough the obtained negative pattern to reproduce the negative pattern on the surface of the photosensitive resin layer.

Adhesion between the photosensitive resin layer and the infrared ablation layer is important for the flexographic printing plate precursor for LAM printing, since the infrared ablation layer is preformed on the photosensitive resin layer.

In view of the importance of the adhesion, for example, PTL1 discloses the adhesion between a photosensitive resin layer and an infrared ablation layer is increased when the infrared ablation layer contains a binder polymer that is compatible with a binder polymer contained in the photosensitive resin layer.

CITATION LIST

Patent Literature

PTL1: JP 2006-163284 A

SUMMARY OF INVENTION

Technical Problem

Since the flexographic printing plate precursor is as thin as several millimeters, a bending stress may be applied to the precursor during the handling thereof. When the bending stress is applied to the conventional flexographic printing plate precursor, cracks and wrinkles are easily formed in the infrared ablation layer. In addition, the surface of the precursor (i.e., the infrared ablation layer) may come into physical contact with some object on the handling of the precursor. Scratches are easily made on the infrared ablation layer of the conventional precursor by the contact.

An object of the present invention is to provide a flexographic printing plate precursor in which formation of cracks and wrinkles in an infrared ablation layer is prevented and a scratch resistance of the infrared ablation layer is improved.

Solution to Problem

In order to solve the problem, the flexographic printing plate precursor according to a preferred embodiment of the present invention comprises a support, a photosensitive resin layer, and an infrared ablation layer that are mutually laminated, wherein the infrared ablation layer comprises a binder polymer and an infrared absorbing material, the binder polymer contained in the infrared ablation layer comprises a polymer (A) and an acrylic resin (B), the polymer (A) comprising the same structural unit as a structural unit contained in a binder polymer in the photosensitive resin layer, and a mass ratio (A/B) of the component (A) with respect to the component (B) being within a range of 1/3 to 3/1, and a difference between a plastic hardness (Ha) of the infrared ablation layer in a state in which the infrared ablation layer is laminated on the photosensitive resin layer and a plastic hardness (Hb) of the photosensitive resin layer is 30 mN/mm$^2$ or smaller.

It is preferable that the component (B) has a storage elastic modulus within a range of $1.0 \times 10^9$ to $4.1 \times 10^9$ Pa. It is also preferable that the component (B) has a glass transition temperature within a range of 48° C. to 85° C.

It is preferable that the binder polymer contained in the infrared ablation layer is compatible with a low-molecular-weight ingredient contained in the photosensitive resin layer. It is also preferable that the photosensitive resin layer is made of a resin composition comprising a water-dispersible latex, a rubber, a surfactant, a photopolymerizable unsaturated compound, and a photopolymerization initiator.

Advantageous Effects of Invention

In the flexographic printing plate precursor according the preferred embodiment of the present invention, the specific two kinds of polymers are contained in the binder polymer in the infrared ablation layer at a specific ratio, and the relationship between the plastic hardnesses of the infrared ablation layer and the photosensitive resin layer is defined. Thus, formation of cracks and wrinkles in the infrared ablation layer is suppressed upon application of a bending stress to the precursor. In addition, scratches are not easily made on the infrared ablation layer when the surface of the precursor is in physical contact with some object, and thus, the infrared ablation layer has an improved scratch resistance.

When the storage elastic modulus of the component (B) is within the specific range, the above-described effects are ensured. Further, when the glass transition temperature of the component (B) is within the specific range, the above-described effects are ensured.

When the binder polymer contained in the infrared ablation layer is compatible with a low-molecular-weight ingredient contained in the photosensitive resin layer, the adhesion between the photosensitive resin layer and the infrared ablation layer is increased. Further, when the photosensitive resin layer is made of the composition containing the specific ingredients, the photosensitive resin layer has a high flexibility, and thus the adhesion between the photosensitive resin layer and the infrared ablation layer is increased.

DESCRIPTION OF EMBODIMENTS

Figure 1:
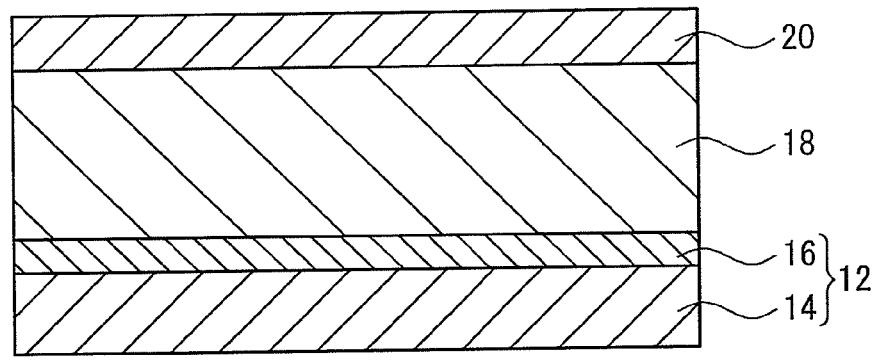
FIG. 1 is a cross-sectional view showing a flexographic printing plate precursor according to a preferred embodiment of the present invention.
Figure 2:
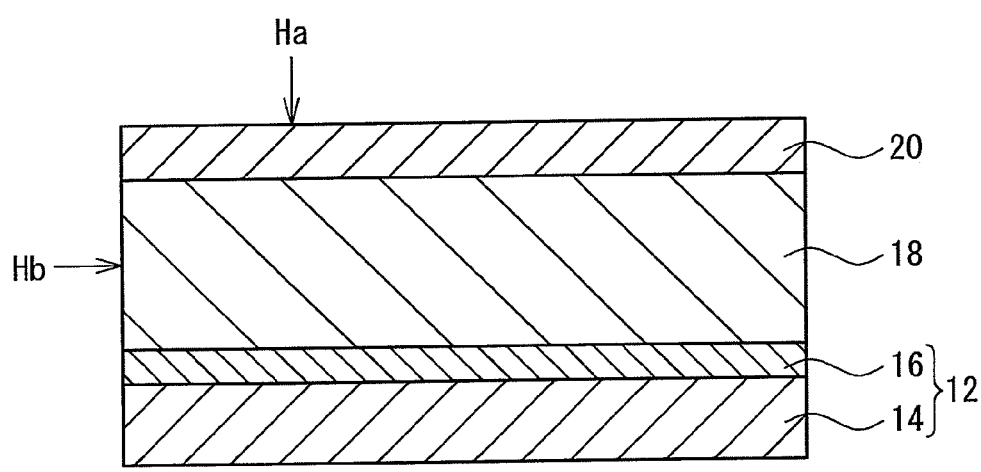
FIG. 2 is a cross-sectional view illustrating a method for measuring a plastic hardness of the same.

A detailed description of a preferred embodiment of the present invention will now be provided. FIG. 1 is a cross-sectional view showing a flexographic printing plate precursor according to the preferred embodiment of the present invention. FIG. 2 is a cross-sectional view illustrating a method for measuring a plastic hardness of the precursor. FIG. 3 is a set of cross-sectional views showing manufacturing processes of the precursor. FIG. 4 is a set of cross-sectional views showing manufacturing processes of a flexographic printing plate.

As shown in FIG. 1, in a flexographic printing plate precursor 10 according to a preferred embodiment of the present invention, a support 12, a photosensitive resin layer 18, and an infrared ablation layer 20 are laminated.

The support 12 supports the photosensitive resin layer 18 and the infrared ablation layer 20 formed on the support 12. The support 12 consists of a substrate 14 covered with an adhesive 16. Examples of the substrate 14 of the support 12 include a resin film. Preferable examples of the resin film include a polyester film such as a PET film because of its excellent dimensional stability. The thickness of the substrate 14 is preferably within a range of 50 to 300 μm in view of providing a sufficient toughness to support the laminated structure containing the photosensitive resin layer 18. The thickness is more preferably within a range of 50 to 200 μm. The adhesive 16 increases adhesion between the substrate 14 and the photosensitive resin layer 18. If the adhesion between the substrate 14 and the photosensitive resin layer 18 is strong enough, the adhesive 16 may be omitted.

The photosensitive resin layer 18 adheres to the support 12 through the adhesive 16. The photosensitive resin layer 18 is made of a photosensitive resin composition that contains a binder polymer, a photosensitive unsaturated compound, and a photopolymerization initiator. Since the layer 18 contains the photopolymerizable unsaturated compound, the layer 18 is cured with (ultraviolet) light. The layer 18 preferably has a thickness of 0.01 to 10 mm. When the thickness is 0.01 mm or larger, a sufficient relief depth is ensured. On the other hand, when the thickness is 10 mm or smaller, the weight of the flexographic printing plate precursor 10 is suppressed, and thus the precursor 10 can be practically used for printing.

The binder polymer in the photosensitive resin layer 18 preferably contains a hydrophilic water-dispersible latex as well as a hydrophobic rubber in view of water developability of the layer 18. The water-dispersible latex is derived from a water dispersion of latex, in which polymer particles as a dispersoid are dispersed in water. The polymer particles are obtained by removing water from the water dispersion of latex. The water-dispersible latex imparts water developability to the photosensitive resin layer 18.

The content of the water-dispersible latex defined as the ratio of the mass of the latex to the total mass of the hydrophobic rubber and the latex is preferably within a range of 20 to 90%, more preferably within a range of 30 to 80%, and still more preferably within a range of 50 to 70%. When the mass ratio is 20% or larger, water development can be carried out at a high speed because of high permeability of the photosensitive resin layer 18 to an aqueous developing solution. On the other hand, when the content is 90% or smaller, a high image reproducibility is achieved.

Examples of the water-dispersible latex include polybutadiene latex, a natural rubber latex, a styrene-butadiene copolymer latex, an acrylonitrile-butadiene copolymer latex, a polychloroprene latex, a polyisoprene latex, a polyurethane latex, a methyl methacrylate-butadiene copolymer latex, a vinylpyridine polymer latex, a butyl polymer latex, a thiokol polymer latex, and an acrylate polymer latex, as well as a copolymer of one of the above-described latex polymers and another component such as acrylic acid and methacrylic acid. They may be used singly or in combination.

Among them, a water-dispersible latex that contains a butadiene skeleton or an isoprene skeleton in the molecular chain is preferable in view of hardness. Specific examples of the preferable latex include a polybutadiene latex, a styrene-butadiene copolymer latex, an acrylonitrile-butadiene copolymer latex, a methyl methacrylate-butadiene copolymer latex, an acrylate-methyl methacrylate-butadiene copolymer latex, and a polyisoprene latex.

The hydrophobic rubber acts to increase the rubber elasticity of the photosensitive resin layer 18, whereby printing on various objects to be printed is facilitated with a printing plate made from the flexographic printing plate precursor 10.

Examples of the hydrophobic rubber include a butadiene rubber (BR), a nitrile rubber (NBR), an acrylic rubber, an epichlorhydrin rubber, a urethane rubber, an isoprene rubber, a styrene-isoprene rubber, a styrene-butadiene rubber, an ethylene-propylene copolymer, a chlorinated polyethylene, a styrene-butadiene-styrene (SBS) copolymer, and a styrene-isoprene-styrene (SIS) copolymer. Examples of the rubber also include a partially or completely hydrogenated derivative of one of the rubbers having unsaturated bonds among the above-listed rubbers. They may be used singly or in combination. Among them, the butadiene rubber (BR) and the nitrile rubber (NBR) are preferable because they impart an excellent balance between the water developability and the drying property to the photosensitive resin layer 18 when they are contained in the layer 18 in combination with the water-dispersible latex.

Containing the photopolymerizable unsaturated compound, the photosensitive resin layer 18 is cured with (ultraviolet) light. The content of the compound is preferably within a range of 10 to 80 mass %, and more preferably within a range of 20 to 50 mass %. When the content is 10 mass % or more, the crosslinking density in the layer 18 on photopolymerization is prevented from being insufficient, and a good image reproducibility and a high ink resistance are imparted to the layer 18. On the other hand, when the content is 80 mass % or less, a relief pattern formed on the flexographic printing plate precursor 10 is prevented from being fragile, and a sufficient flexibility, which is a characteristic feature of a flexographic printing plate, is imparted to the flexographic printing plate precursor 10.

Examples of the photopolymerizable unsaturated compound include an ethylenic unsaturated compound. Examples of the ethylenic unsaturated compound include a (meth) acrylic monomer, a (meth)acrylic oligomer, and a (meth) acrylic modified polymer. Examples of a (meth)acrylic modified polymer include (meth)acrylic modified butadiene rubber and a (meth)acrylic modified nitrile rubber.

The ethylenic unsaturated compound may contain only one ethylenic unsaturated bond or may contain two or more ethylenic unsaturated bonds.

Examples of the ethylenic unsaturated compound containing only one ethylenic unsaturated bond include a (meth) acrylate containing a hydroxyl group such as 2-hydroxyethyl (meth)acrylate, 2-hydroxypropyl(meth)acrylate, 2-hydroxybutyl(meth)acrylate, 3-chloro-2-hydroxypropyl (meth)acrylate, and β-hydroxy-β'-(meth)acryloyloxyethyl phthalate; an alkyl(meth)acrylate such as methyl(meth)acrylate, ethyl(meth)acrylate, propyl(meth)acrylate, butyl(meth) acrylate, isoamyl(meth)acrylate, 2-ethylhexyl(meth)acrylate, lauryl(meth)acrylate, and stearyl(meth)acrylate; a cycloalkyl(meth)acrylate such as cyclohexyl(meth)acrylate; a halogenated alkyl(meth)acrylate such as chloroethyl(meth) acrylate and chloropropyl(meth)acrylate; an alkoxyalkyl (meth)acrylate such as methoxyethyl(meth)acrylate, ethoxyethyl(meth)acrylate, and butoxyethyl(meth)acrylate; a phenoxyalkyl(meth)acrylate such as phenoxyethyl(meth) acrylate and nonylphenoxyethyl(meth)acrylate; an alkoxyalkylene glycol(meth)acrylate such as ethoxydiethylene glycol(meth)acrylate, methoxytriethylene glycol(meth)acrylate, and methoxydipropylene glycol(meth)acrylate; 2,2-dimethylaminoethyl(meth)acrylate; 2,2-diethylaminoethyl(meth) acrylate; 2-hydroxyethyl(meth)acrylate; and 3-chloro-2-hydroxypropyl(meth)acrylate.

Examples of the ethylenic unsaturated compound containing two or more ethylenic unsaturated bonds include an alkyldioldi(meth)acrylate such as 1,9-nonanedioldi(meth)acrylate; a polyethylene glycoldi(meth)acrylate such as diethyleneglycoldi(meth)acrylate; a polypropylene glycoldi (meth)acrylate such as dipropyleneglycoldi(meth)acrylate; trimethylolpropane tri(meth)acrylate; pentaerythritol tri (meth)acrylate; pentaerythritol tetra(meth)acrylate; glycerol tri(meth)acrylate; a polyvalent(meth)acrylate synthesized by an addition reaction of a compound having an ethylenic unsaturated bond and an active hydrogen such as an unsaturated carboxylic acid and an unsaturated alcohol to ethylene glycol diglycidyl ether; a polyvalent(meth)acrylate synthesized by an addition reaction of a compound having an active hydrogen such as a carboxylic acid and an amine to an unsaturated epoxy compound such as glycidyl(meth)acrylate; a polyvalent(meth)acrylamide such as methylene-bis-(meth) acrylamide; and a polyvalent vinyl compound such as divinylbenzene.

The photopolymerization initiator is not limited specifically, and it is essential only that the photopolymerization initiator should initiate photopolymerization of the photopolymerizable unsaturated compound. Examples of the photopolymerization initiator include alkylphenone type, acetophenone type, benzoine ether type, benzophenone type, thioxanthone type, anthraquinone type, benzyl type, and biacetyl type photopolymerization initiators. Specific examples of the photopolymerization initiator include benzyldimethylketal, 2-hydroxy-2-methyl-1-phenyl-propane-1-one, methyl-O-benzoylbenzoate, and 1-hydroxycyclohexyl phenyl ketone.

The content of the photopolymerization initiator is preferably within a range of 0.3 to 5 mass %, and more preferably within a range of 0.5 to 3 mass %. When the content is 0.3 mass or more, photopolymerization of the photopolymerizable unsaturated compound proceeds sufficiently, whereby a high-quality image can be obtained. On the other hand, when the content is 5 mass or less, the photosensitive resin layer 18 is prevented from being too photosensitive, whereby an exposure time of the flexographic printing plate precursor 10 can be easily controlled.

The photosensitive resin layer 18 may further contain other additives. Examples of the additives include a surfactant, a plasticizer, a thermopolymerization inhibitor (i.e., a stabilizer), an ultraviolet absorber, a dye, a pigment, a defoaming agent, and a flavor.

The surfactant improves the water developability of the photosensitive resin layer 18. The content of the surfactant, which is defined as the ratio of the mass of the surfactant to the total mass of the water-dispersible latex, the hydrophobic rubber, and the surfactant, is preferably within a range of 0.1 to 20%, more preferably within a range of 0.1 to 15%, and still more preferably within a range of 0.1 to 10%. When the content is 0.1% or more, water development can be accomplished in a short period of time because of high permeability of the photosensitive resin layer 18 to the aqueous developing solution. On the other hand, when the content is 20% or less, a high drying property is achieved.

Examples of the surfactant include a cationic surfactant, an anionic surfactant, and a nonionic surfactant. Among them, the anionic surfactant is preferable.

Examples of the anionic surfactant include an aliphatic carboxylate such as sodium laurate and sodium oleate; a sulfate ester salt of a higher alcohol such as sodium lauryl sulfate, sodium cetyl sulfate, and sodium oleyl sulfate; a polyoxyethylene alkyl ether sulfate ester salt such as a sodium polyoxyethylene lauryl ether sulfate; a polyoxyethylene alkylaryl ether sulfate ester salt such as a sodium polyoxyethylene octylphenyl ether sulfate and a sodium polyoxyethylene nonylphenyl ether sulfate; an alkyl sulfate salt such as an alkyldiphenyl ether disulfonate salt, sodium dodecylbenzene sulfonate, and a sodium dialkyl sulfosuccinate; an alkylaryl sulfonate salt such as an alkyl disulfonate salt, sodium dodecylbenzene sulfonate, sodium dibutylnaphthalene sulfonate, and sodium triisopropylnaphthalene sulfonate; a phosphate ester salt of a higher alcohol such as disodium lauryl phosphate and sodium dilauryl phosphate; and a phosphate ester salt of polyoxyethylene alkyl ether such as a disodium polyoxyethylene lauryl ether phosphate and a sodium polyoxyethylene dilaurylether phosphate. They may be used singly or in combination. Though sodium salts are presented above as the examples of the surfactant, the surfactant is not limited to the sodium salts. Calcium salts and ammonium salts bring the same effect. Among the above-described examples of the anionic surfactant, a sulfonate surfactant such as the alkyl sulfonate and the alkylaryl sulfonate is more preferable in view of a more excellent water developability of the photosensitive resin layer 18.

The plasticizer imparts flexibility to the photosensitive resin layer 18. The imparted flexibility reduces the hardness of the layer 18, whereby the layer 18 can contain an increased amount of the photopolymerizable unsaturated compound. Thus, the ink resistance of the layer 18 is improved. The content of the plasticizer is preferably within a range of 0.1 to 30 mass %, and more preferably within a range of 5 to 20 mass %. When the content is 0.1 mass % or more, flexibility is effectively imparted to the layer 18, whereby resistance to a solvent ink (i.e., resistance to swelling by a solvent ink) of the layer 18 is improved. On the other hand, when the content is 30 mass % or less, toughness of the layer 18 is ensured.

Examples of the plasticizer include a liquid rubber, an oil, a polyester, and a phosphate compound. A plasticizer that has a good compatibility with the water-dispersible latex or the hydrophobic rubber is especially preferable. Examples of the liquid rubber include a liquid polybutadiene and a liquid polyisoprene as well as their derivatives modified by maleic acid or an epoxy group. Examples of the oil include a paraffin, a naphthene, and an aromatic. Examples of the polyester include an adipate polyester. Examples of the phosphate compound include a phosphate ester.

The thermopolymerization inhibitor (i.e., stabilizer) improves the thermal stability on kneading and storage stability of the photosensitive resin composition. Examples of the thermopolymerization inhibitor include phenol type, hydroquinone type, and catechol type thermopolymerization inhibitors. The content of the thermopolymerization inhibitor is generally within a range of 0.001 to 5 mass %.

The photosensitive resin layer 18 is preferably made of a material having a higher flexibility in order to have better adhesion to the infrared ablation layer 20 in contact with the photosensitive resin layer 18. In this view, the photosensitive resin layer 18 is preferably made of a photosensitive resin composition that contains the water-dispersible latex, hydrophobic rubber, surfactant, photopolymerizable unsaturated compound, and photopolymerization initiator. More preferably, the composition further contains the plasticizer.

The photosensitive resin composition making up the photosensitive resin layer 18 may be prepared by dehydrating a mixture of the ingredients while kneading the mixture. Alternatively, the composition may be prepared first by dehydrating the water dispersion of latex and subsequently by kneading the mixture of the polymer derived from the water dispersion of latex together with the ingredients other than the polymer. Examples of a kneading device used in the kneading process include a twin-screw extruder, a single-screw extruder, a kneader, and a Banbury mixer.

The infrared ablation layer 20 covers a surface of the photosensitive resin layer 18 as a mask. The infrared ablation layer 20 can be removed by irradiation with an infrared laser beam. Portions of the infrared ablation layer 20 that are not removed by the infrared laser beam block (i.e., absorb) ultraviolet light and shield the portions of photosensitive resin layer 18 thereunder from ultraviolet irradiation as a mask. The infrared ablation layer 20 is adhered to the surface of the photosensitive resin layer 18 opposite to the side on which the support 12 is placed. The thickness of the infrared ablation layer 20 is preferably within a range of 0.1 to 5 μm in view of blocking ultraviolet light. The infrared ablation layer 20 is made of a resin composition that contains a binder polymer and an infrared absorbing material.

The binder polymer contained in the infrared ablation layer 20 contains a polymer (A) and an acrylic resin (B). The polymer (A) has the same structural unit as a structural unit contained in the binder polymer in the photosensitive resin layer 18.

The polymer (A) contains the same monomer unit or the same block unit as a monomer unit or a block unit in the molecular structure of the binder polymer contained in the photosensitive resin layer 18. For example, when the binder polymer contained in the photosensitive resin layer 18 is NBR, SBR, BR, or SBS, they contain a structure deriving from butadiene as a common monomer unit. In addition, when the NBR, SBR, or the SBS is a block copolymer, they contain a structure deriving from polybutadiene as a common block unit. In these cases, examples of the polymer (A) include a polymer containing a structure deriving from butadiene as a monomer unit and a polymer containing a structure deriving from polybutadiene as a block unit. Specific examples of such polymers contain NBR, SBR, BR, and SBS.

For another example, when the binder polymer in the photosensitive resin layer 18 is an acrylonitrile-butadiene copolymer (NBR), the binder polymer contains a structure deriving from acrylonitrile as well as a structure deriving from butadiene. In addition, when the NBR is a block copolymer, the binder polymer contains a structure deriving from polyacrylonitrile. Thus, examples of the polymer (A) include a polymer containing a structure deriving from acrylonitrile as a monomer unit and a polymer containing a structure deriving from polyacrylonitrile as a block unit. Specific examples of such polymers include NBR and acrylonitrile-isoprene copolymer.

For yet another example, when the binder polymer in the photosensitive resin layer 18 is a styrene-butadiene copolymer (SBR) or a styrene-butadiene-styrene copolymer (SBS), the binder polymer contains a structure deriving from styrene as well as a structure deriving from butadiene. In addition, when the SBR or SBS is a block copolymer, the binder polymer contains a structure deriving from polystyrene. Thus, examples of the polymer (A) include a polymer containing a structure deriving from styrene as a monomer unit and a polymer containing a structure deriving from polystyrene as a block unit. Examples of such polymers include SBR, SBS, and styrene-isoprene-styrene copolymer (SIS).

Since the polymer (A) contains the same structural unit as the structural unit contained in the binder polymer in the photosensitive resin layer 18, the adhesion between the infrared ablation layer 20 and the photosensitive resin layer 18 is increased.

The acrylic resin (B) is a polymer or a copolymer of one or more selected from acrylic acid, methacrylic acid, an acrylic ester, and a methacrylic ester.

The mass ratio (A/B) of the component (A) to the component (B) is within a range of 1/3 to 3/1. Since the mass ratio A/B is within the range, both prevention of formation of cracks and wrinkles and resistance to scratches are achieved in the infrared ablation layer 20. If the mass ratio A/B is smaller than 1/3 (i.e., if the amount of the component (A) is too small), cracks and wrinkles could be made when a bending stress is applied to the infrared ablation layer 20. On the other hand, if the mass ratio A/B is larger than 3/1 (i.e., if the amount of the component (A) is too large), scratches could be easily formed on the surface of the infrared ablation layer 20 when the layer 20 comes into a physical contact with some object, and thus the scratch resistance of the layer 20 could be reduced. The mass ratio A/B is preferably within a range of 1/2 to 2/1.

The acrylic resin (B) preferably has a storage elastic modulus within a range of $1.0 \times 10^9$ to $4.1 \times 10^9$ Pa. If the modulus is smaller than $1.0 \times 10^9$ Pa, the scratch resistance of the infrared ablation layer 20 tends to be low because the layer 20 is too soft. On the other hand, if the modulus is larger than $4.1 \times 10^9$ Pa, cracks and wrinkles are easily formed in the infrared ablation layer 20 because the layer 20 is too hard. The modulus is more preferably within a range of $1.0 \times 10^9$ to $3.5 \times 10^9$ Pa, and still more preferably within a range of $1.0 \times 10^9$ to $2.5 \times 10^9$ Pa. Here, the storage elastic modulus is measured with a dynamic viscoelasticity meter at 25° C. Examples of the dynamic viscoelasticity meter include 'Rheogel-E4000F' manufactured by UBM.

The acrylic resin (B) preferably has a glass transition temperature (Tg) within a range of 48° C. to 85° C. If the Tg is lower than 48° C., the infrared ablation layer 20 is too soft to have a sufficient scratch resistance. On the other hand, if the Tg is higher than 85° C., the infrared ablation layer 20 is too hard, and thus cracks and wrinkles are easily formed in the layer 20. The Tg is more preferably within a range of 48° C. to 70° C., and still more preferably within a range of 50° C. to 65° C. The Tg is measured in accordance with the "testing method for transition temperatures of plastics" defined in JIS K7121.

It is preferable that the binder polymer in the infrared ablation layer 20 is compatible with a low-molecular-weight ingredient contained in the photosensitive resin layer 18. Examples of the low-molecular weight ingredient in the layer 18 include the photopolymerizable unsaturated compound, which is an essential ingredient, and the plasticizer and surfactant, which are not essential ingredients. The binder polymer in the infrared ablation layer 20 may compatible with all of the low-molecular weight ingredients contained in the photosensitive resin layer 18, or may be compatible with some of them.

Among the ingredients making up the binder polymer in the infrared ablation layer 20, only the component (A) may be compatible with the low-molecular-weight ingredient contained in the photosensitive resin layer 18. Alternatively, only the component (B) may be compatible with the low-molecular-weight ingredient. Yet alternatively, both components (A) and (B) may be compatible with the low-molecular weight ingredient.

In order to be compatible with the low-molecular-weight ingredient contained in the photosensitive resin layer 18, the binder polymer in the infrared ablation layer 20 may contain in its molecular structure a structure that is identical or similar to the structure of the low-molecular-weight ingredient. Alternatively, the binder polymer may contain in its molecular structure a structure having a polarity similar to the polarity of the low-molecular-weight ingredient. Yet alternatively, the binder polymer may contain in its molecular structure a structure highly affinitive to the low-molecular-weight ingredient.

For example, when the photopolymerizable unsaturated compound in the photosensitive resin layer 18 contains a (meth)acrylic monomer, the binder polymer in the infrared ablation layer 20 is compatible with the low-molecular-weight ingredient in the photosensitive resin layer 18 because the binder polymer in the infrared ablation layer 20 contains the acrylic resin (B).

When the photosensitive resin layer 18 contains a liquid BR, a liquid NBR, or a liquid SBR as the low-molecular-weight ingredient, the binder polymer in the infrared ablation layer 20 that contains a butadiene polymer such as BR, NBR, and SBR, or a butadiene copolymer is compatible with the low-molecular-weight ingredient because the (co)polymer and the low-molecular-weight ingredient contain the same structural unit.

When the binder polymer in the infrared ablation layer 20 is a butadiene polymer such as BR, NBR, and SBR, or a butadiene copolymer, an aliphatic hydrocarbon plasticizer is compatible with the binding polymer because the plasticizer has a polarity similar to the polarity of the butadiene structure, which is commonly contained in the above listed (co)polymers. Examples of the plasticizer include a paraffin and a naphthene oil.

The infrared absorbing material in the infrared ablation layer 20 is not limited specifically, and it is essential only that the material absorbs infrared light and converts the infrared light into heat. Examples of the infrared absorbing material include a black pigment such as carbon black, aniline black, and cyanine black; phthalocyanine; a naphthalocyanine green pigment; a rhodamine dye; a naphthoquinone dye; a polymethine dye; a diimonium salt; an azoimonium dye; a chalcogen dye; carbon graphite; iron powders; a diamine metal complex; a dithiol metal complex; a phenylthiol metal complex; a mercaptophenol metal complex; an aryl aluminum complex; an inorganic compound containing crystal water; copper sulfate; an oxide of a metal such as cobalt and tungsten; an hydroxide and a sulfate of one of these metals; and powders of a metal such as bismuth, tin, tellurium, and aluminum. Among them, carbon black and carbon graphite are preferable in view of having ultraviolet absorbing properties.

The content of the infrared absorbing material may be determined so that the material provides a sufficient sensitivity for the infrared ablation layer 20 to be removed by the laser beam used. The content is preferably within a range of 0.1 to 75 mass %, and more preferably within a range of 1 to 50 mass %.

The infrared ablation layer 20 may contain various additives in addition to the ingredients described above. Examples of the additives include a surfactant, a plasticizer, an ultraviolet absorbing material, a parting agent, a dye, a pigment, a defoaming agent, and a flavor. The above-listed specific surfactants and plasticizers for the photosensitive resin layer 18 may also be applied to the infrared ablation layer 20.

The ultraviolet absorbing material preferably has absorption in a wavelength range of 300 to 400 nm. Specific examples of the material include a benzotriazole compound, a triazine compound, a benzophenone compound, a carbon black, and the metals and metal oxides listed above as the preferable examples of the infrared absorbing material.

The parting agent facilitates peeling off of the covering film described below that covers and protects the surface of the infrared ablation layer 20. Examples of the parting agent include an alkyl compound and a silicone compound.

To form the infrared ablation layer 20, a coating liquid is prepared by dissolving the materials described above that makes up the infrared ablation layer 20 in a solvent. Then, the coating liquid is applied onto a base and the solvent is dry-removed. Example of the solvent include a ketone solvent such as a methyl isobutyl ketone and methyl ethyl ketone; an aromatic solvent such as toluene and xylene; an alcohol solvent such as methanol and isopropyl alcohol; an ester solvent such as methyl acetate; a glycol solvent; and a non-proton polar solvent such as N-methylpyrrolidone. They may be used singly or in combination. Examples of the base on which the coating liquid is applied include the covering film that covers the surface of the infrared ablation layer 20.

In the flexographic printing plate precursor 10, a covering film may be formed on the infrared ablation layer 20 to protect the surface of the layer 20 from scratches. The covering film may also act as a base that supports the infrared ablation layer 20 before pressed in the preparation process of the flexographic printing plate precursor 10 as described below.

Since the covering film is peeled off from the infrared ablation layer 20 when the flexographic printing plate precursor 10 is used, the covering film is preferably easy to be peeled off. The covering film is preferably consists of a resin film. Specific examples of the resin film include a polyester film such as a PET film; a polyethylene film such as polycarbonate, polyamide, polyethylene, and polypropylene films; and a polystyrene film. A surface of the covering film that contacts the infrared ablation layer 20 may be coated with a release agent such as a silicone resin. The thickness of the covering film is preferably within a range of 25 to 200 μm, and more preferably within a range of 50 to 150 μm in view of having an excellent handling property and in view of highly protecting the infrared ablation layer 20 from scratches.

In the flexographic printing plate precursor 10, which has the configuration described above, the difference (Hc) between the plastic hardness (Ha) of the infrared ablation layer 20 and the plastic hardness (Hb) of the photosensitive resin layer 18 is 30 mN/mm$^2$ or smaller. Thus, formation of cracks and wrinkles in the infrared ablation layer 20 is prevented when a bending stress is applied to the layer 20. The difference (Hc) is preferably 17 mN/mm$^2$ or smaller, and more preferably 12 mN/mm$^2$ or smaller.

The plastic hardness of each of the layers may be measured with a micro-hardness tester. Since the thickness of the infrared ablation layer 20 is smaller than the indentation depth (i.e., displacement) in the tester, the plastic hardness (Ha) of the infrared ablation layer 20 is measured on the surface of the layer 20 in a state in which the infrared ablation layer 20 is laminated on the photosensitive resin layer 18 as shown in FIG. 2. Meanwhile, the plastic hardness (Hb) of the photosensitive resin layer 18 is measured on a side face of the photosensitive resin layer 18 as shown in FIG. 2.

Figure 3A:
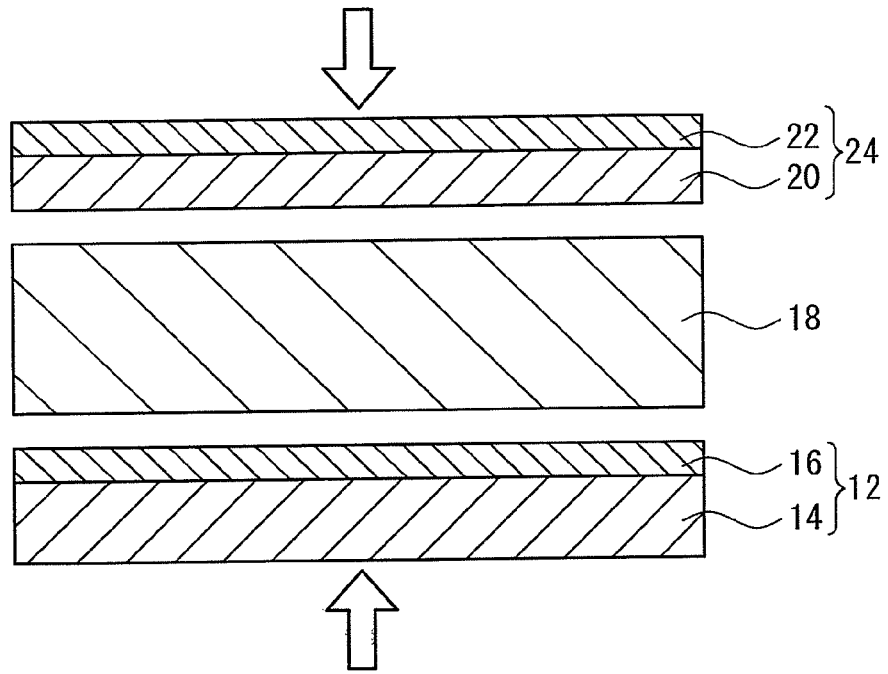
FIGS. 3A-3C are a set of cross-sectional views showing manufacturing processes of the same.

The flexographic printing plate precursor 10 may be prepared as follows: the photosensitive resin making up the photosensitive resin layer 18 is sandwich between the adhesive 16 of the support 12 and the infrared ablation layer 20 of a laminated structure 24 as shown in FIG. 3A. Here, the support 12 consists of the substrate 14 and the adhesive 16 thereon, and the laminated structure 24 consists of the covering film 22 and the resin composition making up the infrared ablation layer 20 coating the covering film 22. Then, the obtained sandwiched structure is pressed at a predetermined temperature until the photosensitive resin composition has a predetermined thickness. The temperature during the pressing is preferably within a range of 70° C. to 120° C. in view of ensuring the adhesion between the photosensitive resin layer 18 and the laser ablation layer 20.

Figure 3B:
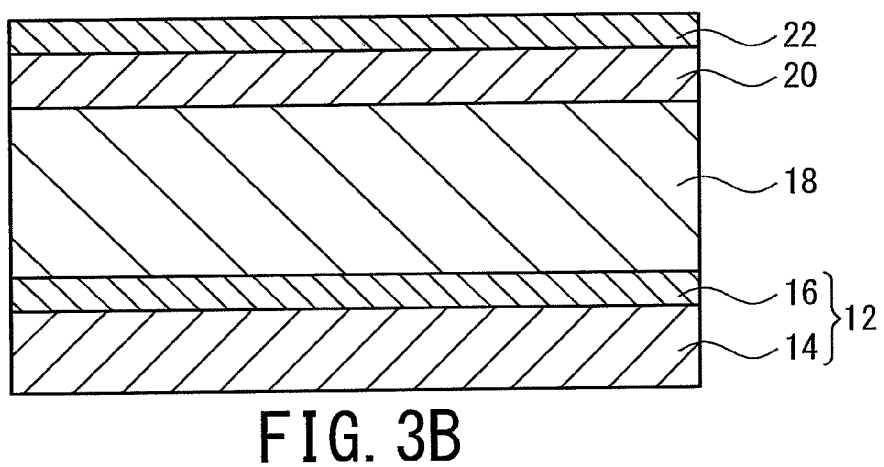
Figure 3C:
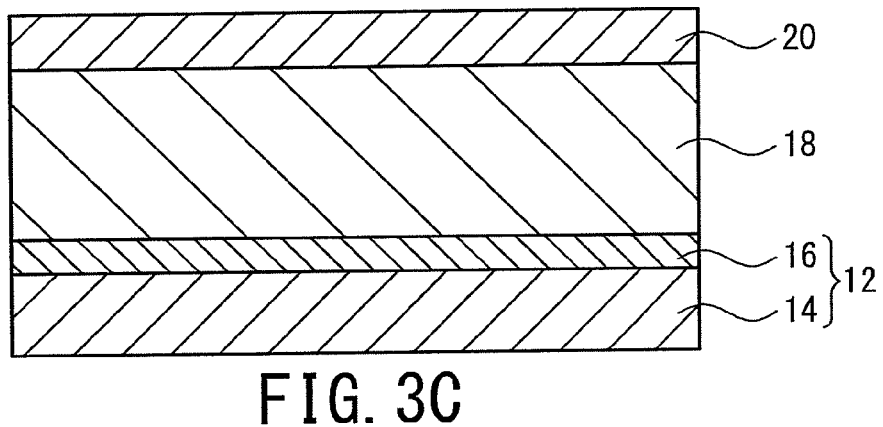

FIG. 3B shows the flexographic printing plate precursor in a state in which the precursor is covered with the covering film 22 on the infrared ablation layer 20. When the covering film 22 is peeled off, the flexographic printing plate precursor 10 shown in FIG. 3C is obtained, in which the support 12, the photosensitive resin layer 18, and the infrared ablation layer 20 are laminated.

Next, illustrated is a method to make a flexographic printing plate from the flexographic printing plate precursor 10 according to the preferred embodiment of the present invention. The flexographic printing plate 30 is made by forming a relief image on the photosensitive resin layer 18 of the precursor 10.

Figure 4A:
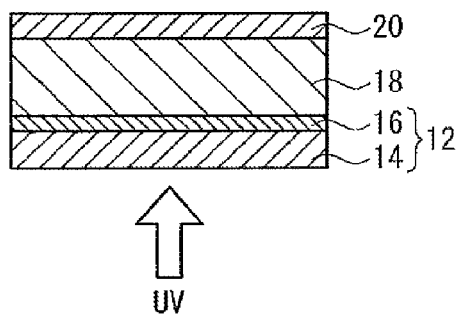
FIGS. 4A-4E are a set of cross-sectional views showing manufacturing processes of a flexographic printing plate.
Figure 4B:
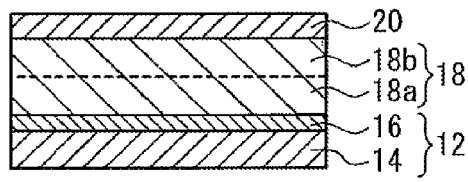

To form the relief image, the precursor 10 is first exposed to ultraviolet light from the support 12 side as shown in FIG. 4A (i.e., back exposure process). By this process, the lower part 18*a* of the photosensitive resin layer 18 is cured to form a so-called floor for the relief image as shown in FIG. 4B.

Figure 4C:
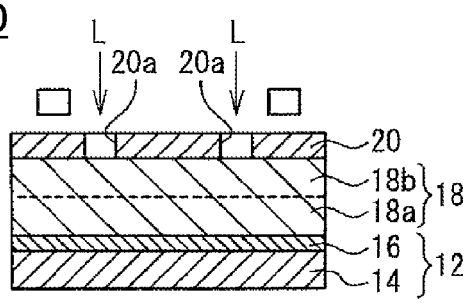

Then, as shown in FIG. 4C, predetermined portions of the infrared ablation layer 20 are removed by irradiating the precursor 10 with an infrared laser beam from the infrared ablation layer 20 side, whereby a predetermined negative pattern 20*a* is formed on the photosensitive resin layer 18 (i.e., drawing process). Thus, a predetermined image mask is formed on the photosensitive resin layer 18. The back exposure process and the drawing process may be carried out in an opposite order, depending on the situation.

Figure 4D:
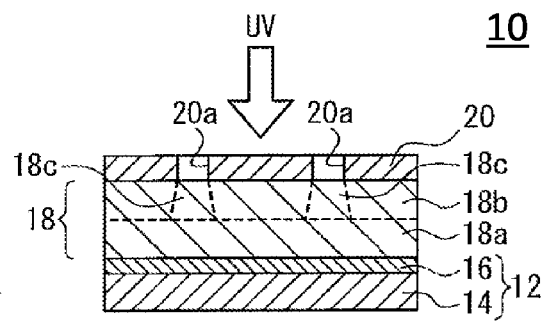

Then, as shown in FIG. 4D, the photosensitive resin layer 18 is exposed to ultraviolet light through the image mask (i.e., main exposure process), whereby portions 18*c* of the upper part 18*b* of the photosensitive resin layer 18 that are not covered with the mask are cured. Now, the photosensitive resin layer 18 has cured portions 18*a*, and 18*c*, and uncured portions (18*b* except 18*c*).

Figure 4E:
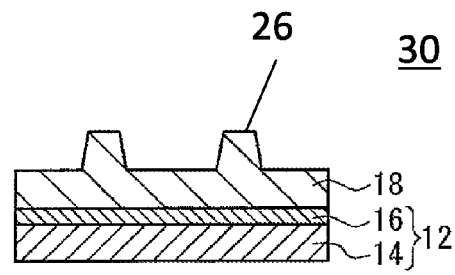

Subsequently, the image mask and the uncured portions (18*b* except 18*c*) of the photosensitive resin layer 18 are removed in a developing solution (i.e., developing process). By this process, a flexographic printing plate 30 having a relief image 26 is obtained as shown in FIG. 4E. Then, a drying process in which the flexographic printing plate 30 is dried and a post-exposure process in which the entire region of the printing plate 30 after dried is exposed to ultraviolet light again may be carried out, if necessary.

In the back and main exposure processes, an ultraviolet source that provides ultraviolet light having a wavelength of 300 to 400 nm may be used. Examples of the ultraviolet source include a high-pressure mercury lamp, ultrahigh-pressure mercury lamp, a metal halide lamp, a xenon lamp, a carbon arc lamp, and a chemical lamp. Examples of the infrared laser used in the drawing process include a solid-state laser such as a ruby laser, an alexandrite laser, a perovskite laser, a Nd-YAG laser, and an emerald-glass laser; a semiconductor laser such as InGaAsP, InGaAs, GaAsAl lasers; and a dye laser such as a rhodamine dye laser.

An aqueous developing solution may be used in the developing process. The aqueous developing solution comprises water and an additive such as a surfactant and a pH control chemical, if necessary. The uncured portions (18*b* except 18*c*) of the photosensitive resin layer 18 may be removed by washing the uncured portions (18*b* except 18*c*) away with a device such as a spray-type developing devise and a brush-type rinsing device.

Since the flexographic printing plate precursor 10 according to the preferred embodiment of the present invention has excellent adhesion between the infrared ablation layer 20 and the photosensitive resin layer 18, pieces of the infrared ablation layer 20 removed from the precursor 10 in the developing process tends to be finely dispersed in the developing solution. Thus suppressed are re-attachment of the removed pieces of the infrared ablation layer 20 to the obtained flexographic printing plate 30 and clogging of a filter used for circulation and filtration of the developing solution.

As described above, the flexographic printing plate precursor 10 according to the preferred embodiment of the present invention has the infrared ablation layer 20 preformed on the photosensitive resin layer 18 and is used for so-called laser-ablation-mask (LAM) printing. In LAM printing, a negative image in a form of digitized information is directly transferred onto the infrared ablation layer 20 with an infrared laser beam to obtain a predetermined negative pattern 20*a*. Subsequently, the surface of the photosensitive resin layer 18 is exposed to light through the obtained negative pattern 20*a* to reproduce a predetermined image on the surface of the photosensitive resin layer 18.

In the flexographic printing plate precursor 10 according to the preferred embodiment of the present invention, excellent adhesion is achieved between the infrared ablation layer 20 and the photosensitive resin layer 18, and formation of cracks and wrinkles in the infrared ablation layer 20 is prevented when a bending stress is applied to the layer 20. In addition, scratches are not easily formed on the surface of the infrared ablation layer 20 when the surface of the layer 20 comes into physical contact with some object, and thus the layer 20 has an excellent scratch resistance. As a result, the flexographic printing plate precursor 10 is excellent in printing workability and provides stable image reproducibility.

EXAMPLE

A description of the present invention will now be specifically provided with reference to Examples. It is to be noted that the present invention is not limited to Examples.

Example 1

<Preparation of Photosensitive Resin Composition (1)>

45.5 parts by mass of latex dispersion in water (containing 25 parts by mass of polymer as a solid content), 15 parts by mass of an acrylic modified liquid BR, and 5 parts by mass of an acryl monomer were mixed and dewatered in a drier at 120° C. for 2 hours to obtain a mixture of the polymer derived from the latex dispersion and the photopolymerizable unsaturated compound. The obtained mixture was kneaded with 30 parts by mass of a BR, 2 parts by mass of a surfactant, and 15 parts by mass of a plasticizer in a kneader for 45 minutes. Then, 0.2 parts by mass of a thermopolymerization inhibitor, 1 part by mass of a photopolymerization initiator, and 0.03 parts by mass of an ultraviolet absorber were supplied into the kneader, and all were kneading for 5 minutes to give a photosensitive resin composition (1).

<Preparation of Composition for Infrared Ablation Layer>

100 parts by mass of a carbon black, 3 parts by mass of a plasticizer, and 812 parts by mass of methyl isobutyl ketone as a solvent were mixed with 100 parts by mass of a binder polymer that consists of 75 parts by mass of an acrylic resin A and 25 parts by mass of an NBR with a blade impeller. The obtained liquid mixture was dispersed with a triple roll mill. Methyl isobutyl ketone was further added to the obtained dispersion mixture to obtain a composition for an infrared ablation layer having a solid content of 15 mass %.

<Preparation of Flexographic Printing Plate Precursor>

The composition for the infrared ablation layer was applied onto a 125-μm thick PET film (i.e., covering film) coated with a silicone release agent with the use of a bar coater to have a thickness after dried of 1 μm. Then the film was dried at 120° C. for 5 minutes to obtain a laminated structure of the infrared ablation layer and the covering film.

Next, the photosensitive resin composition (1) was sandwiched between the surface of the infrared ablation layer of the laminated structure prepared above and an adhesive-coated surface of a 125-μm thick PET film (substrate). Then the composition (1) was pressed with a pressing device heated at 120° C. until the thickness of the composition (1) was 1.5 mm. Thus obtained was a flexographic printing plate precursor according to Example 1, which comprises a support, a photosensitive resin layer, an infrared ablation layer, and a covering film, laminated in the order presented.

Examples 2 to 11, and Comparative Examples 1 to 7

Flexographic printing plate precursors according to Examples 2 to 11 and Comparative Examples 1 to 7 were prepared in the same manner as the precursor according to Example 1 except that the binder polymers in the infrared ablation layers had the compositions and content ratios (i.e., mass ratios) shown in Table 1.

Example 12

<Preparation of Photosensitive Resin Composition (2)>

A photosensitive resin composition (2) was prepared in the same manner as the composition (1) except that 30 parts by mass of an NBR was used instead of the BR.

<Preparation of Flexographic Printing Plate Precursor>

A Flexographic printing plate precursor according to Example 12 was prepared in the same manner as the precursor according to Example 1 except that the composition (2) was used instead of the composition (1) and that the binder polymer in the infrared ablation layer had the composition and content ratio (i.e., mass ratio) shown in Table 1.

Specific materials used are listed below.

<Ingredients of Photosensitive Resin Layer>

(Binder Polymer)

Polymer derived from latex dispersion on water (manuf.: ZEON CORPORATION, trade name: "NIPOL LX111NF")

BR: manuf.: ZEON CORPORATION, trade name: "NIPOL BR1220"

NBR: manuf.: ZEON CORPORATION, trade name: "NIPOL 1042"

(Low-Molecular-Weight Ingredients)

Acrylic modified liquid BR: manuf.: OSAKA ORGANIC CHEMICAL INDUSTRY LTD., trade name: "BAC-45"

Acrylic monomer: manuf.: NOF CORPORATION, 1,9-nonanedioldimethacrylate

Surfactant: manuf.: KAO CORPORATION, trade name: "EMAL 0"

Thermopolymerization inhibitor (hydroquinone monomethyl ether): manuf.: SEIKO CHEMICAL CORPORATION, trade name: "MEHQ"

Photopolymerization initiator: manuf.: CIBA SPECIALTY CHEMICALS INC., trade name: "IRGACURE 651"

Ultraviolet absorber: manuf.: CIBA SPECIALTY CHEMICALS INC., trade name: "TINUVIN 326"

Plasticizer: manuf.: ESSO SEKIYU K.K., trade name: "CRYSTOL 70"

<Ingredients of Photosensitive Resin Layer>

(Binder Polymer)

Acrylic resin A: manuf.: NEGAMI CHEMICAL INDUSTRIAL CO., LTD., tradename: "PRE-COAT 200", $E'=1\times10^9$ Pa, Tg=85° C.

Acrylic resin B: manuf.: NEGAMI CHEMICAL INDUSTRIAL CO., LTD., trade name: "HI PEARL M-5000", $E'=2.5\times10^9$ Pa, Tg=65° C.

Acrylic resin C: manuf.: NEGAMI CHEMICAL INDUSTRIAL CO., LTD., trade name: "HI PEARL M-0603", $E'=1.0\times10^9$ Pa, Tg=48° C.

Acrylic resin D: manuf.: NEGAMI CHEMICAL INDUSTRIAL CO., LTD., trade name: "HI PEARL M-6003", $E'=4.0\times10^9$ Pa, Tg=20° C.

NBR: manuf.: ZEON CORPORATION, trade name: "NIPOL DN101"

SBR: manuf.: ASAHI KASEI CORP., trade name: "TUFDENE 2100R", styrene content: 25 mass %

BR: manuf.: ZEON CORPORATION, trade name: "NIPOL BR1220"

SBS: manuf.: KRATON POLYMERS, trade name: "D1116", styrene content: 23 mass %

(Infrared Absorber)

Carbon black: manuf.: MITSUBISH CHEMICAL CORPORATION, trade name: "MA8"

(Another Ingredient)

Plasticizer: O-acetyl tributyl citrate, manuf.: WAKO PURE CHEMICAL INDUSTRIES, LTD.

For each of the obtained flexographic printing plate precursors, the plastic hardness (Ha) of the infrared ablation layer and the plastic hardness (Hb) of the photosensitive resin layer were measured by the measurement method described below. Then, difference between the measured plastic hardnesses (Hc=Ha−Hb) was evaluated.

(Measurement of Plastic Hardness)

The plastic hardness was measured with a micro-hardness tester ("Microscope H100" manufactured by FISCHER INSTRUMENTS). Since the thickness of the infrared ablation layer is smaller than an indentation depth (i.e., displacement) in the tester, the plastic hardness (Ha) of the infrared ablation layer was measured on the surface of the infrared ablation layer in a state in which the infrared ablation layer is laminated on the photosensitive resin layer after the covering film is peeled off as shown in FIG. 2. Here, the photosensitive resin layer is laminated on the support consisting of the substrate and the adhesive thereon. Meanwhile, the plastic hardness (Hb) of the photosensitive resin layer is measured on the side face of the photosensitive resin layer as shown in FIG. 2. In the measurement, a square-based pyramidal diamond indenter with a face angle of 136° was used. The initial load was 0 mN. The maximum indentation load was 0.5 mN (constant load). The ramp up time to the maximum load was 5 seconds. The ramp down time was 5 seconds.

Further, degree of formation of cracks and wrinkles, scratch resistance, and image reproducibility were evaluated for the flexographic printing plate precursor that was left at room temperature for 24 hours after preparation.

(Evaluation of Cracks and Wrinkles)

From the flexographic printing plate precursor, the covering film was peeled off. The precursor was then placed around a drum of "CDI Spark 2120" (manufactured by ESKO, diameter: 170 mm) with the infrared ablation layer placed on the outer side for 10 min. Next, the precursor is removed off from the drum and left on a flat plane for 10 min. Then, the surface of the infrared ablation layer was visually observed. The precursor on which cracks and wrinkles were observed was regarded as bad. The precursor on which a few wrinkles were observed was regarded as fair. The precursor on which no crack or wrinkle was observed was regarded as good. For the precursor regarded as good was further evaluated in the same manner as in the above-described test except that a cylinder (diameter: 130 mm) was used instead of the drum. If no crack or wrinkle was observed in the test, the precursor was regarded as excellent.

(Scratch Resistance)

A 1×1 cm square stainless steel indenter is pressed onto the surface of the infrared ablation layer of the flexographic printing plate precursor with a load of 20 g and moved forward and backward once for 1 cm along the horizontal direction at a speed of 2.5 mm/s. The scratch trace made by the motion of the indenter was visually observed. If the infrared ablation layer was torn and the photosensitive resin layer inside was exposed, the precursor was regarded as bad. If the infrared ablation layer was not torn and the photosensitive resin layer inside was not exposed, the precursor was regarded as good. The precursor regarded as good was further evaluated in the same manner as in the above-described test except that the load was 40 g. If the infrared ablation layer was not torn in the test, the precursor was regarded as excellent.

(Image Reproducibility)

The negative pattern having a 2% dot at 175 lpi was formed on the infrared ablation layer of each flexographic printing plate precursor with the use of "CDI Spark 2120" manufactured by ESKO. Then, the precursor was exposed to light on the support side (i.e., back exposure was carried out) for 10 seconds in an exposing device having fifteen 20-W chemical lamps with the precursor placed 15 cm apart from the lamps. Then, the precursor was exposed to light on the photosensitive resin layer side (i.e., main exposure was carried out) for 5 minutes in the above-mentioned exposing device with the plate placed 15 cm apart from the lamps. Finally, the plate was rinsed in aqueous developing solution containing a surfactant at 50° C. for 5 minutes and was dried with air heated to 60° C. for 5 minutes. The obtained dot pattern was observed with a microscope ("VH 8000" manufactured by KEYENCE CORPORATION). When the negative pattern having 2% dot at 175 lpi was reproduced, the flexographic printing plate precursor was regarded as good. When the negative pattern was not reproduced, the precursor was regarded as bad.

Table 1 shows the compositions and content ratios of the binder polymers in the infrared ablation layers of the flexographic printing plate precursor according to Examples and Comparative Examples, plastic hardnesses (Ha and Hb) with their difference (Hc), and the results of the evaluations. The content ratios of the ingredients are indicated in part by mass.

TABLE 1

|  | Example | | | | | | | | | | | | Comparative Example | | | | | | |
| --- | --- | --- | --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 1 | 2 | 3 | 4 | 5 | 6 | 7 |
| Composition of binder polymer in infrared ablation layer | | | | | | | | | | | | | | | | | | | |
| Acrylic resin A | 75 | 50 | 25 | — | — | — | — | — | — | — | — | — | 100 | — | — | — | — | — | 90 |
| Acrylic resin B | — | — | — | 75 | 50 | 25 | — | — | — | 50 | 50 | 50 | — | 100 | — | — | — | — | — |
| Acrylic resin C | — | — | — | — | — | — | 75 | 50 | 25 | — | — | — | — | — | 100 | — | — | — | — |
| Acrylic resin D | — | — | — | — | — | — | — | — | — | — | — | — | — | — | — | 100 | — | — | — |
| NBR | 25 | 50 | 75 | 25 | 50 | 75 | 25 | 50 | 75 | — | — | 50 | — | — | — | — | 100 | — | 10 |
| SBR | — | — | — | — | — | — | — | — | — | 50 | — | — | — | — | — | — | — | — | — |
| BR | — | — | — | — | — | — | — | — | — | — | 50 | — | — | — | — | — | — | — | — |

TABLE 1-continued

|  | Example | | | | | | | | | | | | Comparative Example | | | | | | |
| --- | --- | --- | --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 1 | 2 | 3 | 4 | 5 | 6 | 7 |
| SBS | — | — | — | — | — | — | — | — | — | — | — | — | — | — | — | — | — | 100 | — |
| Composition of photo-sensitive resin layer | (1) | (1) | (1) | (1) | (1) | (1) | (1) | (1) | (1) | (1) | (1) | (2) | (1) | (1) | (1) | (1) | (1) | (1) | (1) |
| Plastic hardness (Ha) [mN/mm$^2$] | 64 | 62 | 55 | 59 | 54 | 53 | 55 | 52 | 51 | 53 | 53 | 108 | 89 | 79 | 67 | 60 | 50 | 53 | 86 |
| Plastic hardness (Hb) [mN/mm$^2$] | 47 | 47 | 47 | 47 | 47 | 47 | 47 | 47 | 47 | 47 | 47 | 78 | 47 | 47 | 47 | 47 | 47 | 47 | 47 |
| Difference between Plastic hardnesses (Hc) [mN/mm$^2$] | 17 | 15 | 8 | 12 | 7 | 6 | 8 | 5 | 4 | 6 | 6 | 30 | 42 | 32 | 20 | 13 | 3 | 6 | 39 |
| Evaluation of precursor |  |  |  |  |  |  |  |  |  |  |  |  |  |  |  |  |  |  |  |
| Cracks and wrinkles | G | G | E | E | E | E | E | E | E | E | E | E | B | B | F | E | E | E | B |
| Scratch resistance | E | E | E | E | E | E | E | G | G | E | E | E | E | E | E | B | B | B | E |
| Image reproducibility | G | G | G | G | G | G | G | G | G | G | G | G | — | — | G | G | G | G | — |

E = Excellent;
G = Good;
F = Fair;
B = Bad

In the flexographic printing plate precursor according to Comparative Examples 1 and 2, the difference between the plastic hardnesses of the infrared ablation layer and the photosensitive resin layer is too large because the relatively hard acrylic resins are singly contained in the binder polymers in the infrared ablation layers. Thus, the infrared ablation layers are too hard, and cracks made by the bending stress applied to the layers on formation of the negative patterns were observed by visual inspection. Therefore, the image reproducibility was impossible to be evaluated for the precursors. In the precursor according to Comparative Example 3, the acrylic resin is singly contained in the binding polymer, though the acrylic resin is softer than the acrylic resin used in Comparative Examples 1 and 2. Wrinkles made by the bending stress applied on formation of the negative pattern remains in the infrared ablation layer. Meanwhile, in the precursor according to Comparative Example 4, the relatively soft acrylic resin is singly contained in the binder polymer in the infrared ablation layer. While no crack or wrinkle was observed in the infrared ablation layer, the layer is too soft to have a sufficient scratch resistance. In the precursors according to Comparative Examples 5 and 6, the rubbers are singly contained in the binder polymers in the infrared ablation layers. The layers are too soft to have a sufficient scratch resistance. In the precursor according to Comparative Example 7, the relatively hard acrylic resin and the rubber are contained in the binder polymer in combination. However, the content of the rubber is too small. Thus, the difference between the plastic hardnesses of the photosensitive resin layer and the infrared ablation layer is too large, and cracks are formed in the layer. Therefore, the image reproducibility was impossible to be evaluated for the precursor.

Meanwhile, in the flexographic printing plate precursors according to Examples, no crack or wrinkle was observed in the infrared ablation layers, and it was confirmed that the precursors are excellent in image reproducibility. Further, it was confirmed that the infrared ablation layers are excellent in scratch resistance.

The foregoing description of the preferred embodiments of the present invention has been presented for purposes of illustration and description; however, it is not intended to be exhaustive or to limit the present invention to the precise form disclosed, and modifications and variations are possible as long as they do not deviate from the principles of the present invention.

The invention claimed is:

1. A flexographic printing plate precursor that comprises a support, a photosensitive resin layer, and an infrared ablation layer that are mutually laminated, wherein
   the infrared ablation layer comprises a binder polymer and an infrared absorbing material,
   the binder polymer contained in the infrared ablation layer comprises a polymer (A) and an acrylic resin (B), the polymer (A) comprising the same structural unit as a structural unit contained in a binder polymer in the photosensitive resin layer, and a mass ratio (A/B) of the component (A) with respect to the component (B) being within a range of 1/3 to 3/1,
   the component (B) has a glass transition temperature within a range of 48° C. to 85° C., and
   a difference between a plastic hardness (Ha) of the infrared ablation layer in a state in which the infrared ablation layer is laminated on the photosensitive resin layer and a plastic hardness (Hb) of the photosensitive resin layer is 30 mN/mm² or smaller.

2. The flexographic printing plate precursor according to claim 1, wherein the component (B) has a storage elastic modulus within a range of $1.0\times10^9$ to $4.1\times10^9$ Pa.

3. The flexographic printing plate precursor according to claim 2, wherein the binder polymer contained in the infrared ablation layer is compatible with a low-molecular-weight ingredient contained in the photosensitive resin layer.

4. The flexographic printing plate precursor according to claim 3, wherein the photosensitive resin layer is made of a resin composition comprising a water-dispersible latex and a rubber as the binder polymer, a surfactant and/or a photopolymerizable unsaturated compound as the low-molecular weight ingredient, and a photopolymerization initiator.

5. The flexographic printing plate precursor according to claim 2, wherein the photosensitive resin layer is made of a resin composition comprising a water-dispersible latex and a rubber as the binder polymer, a surfactant, a photopolymerizable unsaturated compound, and a photopolymerization initiator.

6. The flexographic printing plate precursor according to claim 1, wherein the binder polymer contained in the infrared ablation layer is compatible with a low-molecular-weight ingredient contained in the photosensitive resin layer.

7. The flexographic printing plate precursor according to claim 6, wherein the photosensitive resin layer is made of a resin composition comprising a water-dispersible latex and a rubber as the binder polymer, a surfactant, a photopolymerizable unsaturated compound, and a photopolymerization initiator.

8. The flexographic printing plate precursor according to claim 1, wherein the photosensitive resin layer is made of a resin composition comprising a water-dispersible latex and a rubber as the binder polymer, a surfactant, a photopolymerizable unsaturated compound, and a photopolymerization initiator.

* * * * *